United States Patent
Hikiyama et al.

(10) Patent No.: US 6,392,939 B1
(45) Date of Patent: May 21, 2002

(54) SEMICONDUCTOR MEMORY DEVICE WITH IMPROVED DEFECT ELIMINATION RATE

(75) Inventors: Yoshiyuki Hikiyama; Hisao Kobashi; Tetsushi Hoshita, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/615,898

(22) Filed: Jul. 13, 2000

(30) Foreign Application Priority Data

Jan. 21, 2000 (JP) ........................................ 2000-012723

(51) Int. Cl.[7] .................................................. G11C 7/00
(52) U.S. Cl. .................... 365/201; 365/203; 365/230.06
(58) Field of Search ............................. 365/201, 230.04, 365/230.06, 203, 189.01, 230.01

(56) References Cited

U.S. PATENT DOCUMENTS 5,241,500 A * 8/1993 Barth, Jr. et al. ......... 365/189.01
5,854,770 A * 12/1998 Pascucci ................... 365/230.03
5,949,731 A * 9/1999 Tsukude .................... 365/230.01
5,986,917 A * 11/1999 Lee ............................... 365/96
5,995,427 A * 11/1999 Tsukikawa .................... 365/201
6,055,199 A * 4/2000 Hamade et al. .............. 365/201

FOREIGN PATENT DOCUMENTS

| EP | 059360 A1 | * 6/1992 | ............ G11C/29/00 |
| JP | 410125096 A | * 6/1992 | ............ G11C/29/00 |
| JP | 5-180907 | 7/1993 | |

* cited by examiner

*Primary Examiner*—Hoai V. Ho
(74) *Attorney, Agent, or Firm*—McDermott, Will & Emery

(57) ABSTRACT

During a burn-in test, a test mode signal TMRS is set to the H level, and word lines WL0 to WL3 can be activated by composite gates according to row address signals RA0 to RA3, respectively. Therefore, a potential difference and a high electric field are provided even between word lines WL0, WL2 during the burn-in test. Thus, the defect elimination rate during the burn-in test can be improved.

9 Claims, 7 Drawing Sheets

SEMICONDUCTOR MEMORY DEVICE WITH IMPROVED DEFECT ELIMINATION RATE

BACKGROUND OF THE INVENTION

1. Field of the Invention

The present invention relates to semiconductor memory devices, and more particularly to a semiconductor memory device capable of efficiently detecting a defect during a burn-in test.

2. Description of the Background Art

Generally, device failures are caused roughly in the three periods of the initial failure period, the accidental failure period and the ware-out failure period in order of time.

In the initial failure period, defects which are caused during the device manufacturing process come to the surface as failures, and initial failures appear immediately after the start of use. The initial failure rate decreases rapidly with time.

Thereafter, the accidental failure period follows during which a low failure rate continues for a certain period.

Then, the device comes closer to its useful life and enters the ware-out failure period during which the failure rate increases rapidly.

Desirably, the device is used within the accidental failure period. This period corresponds to the useful life. In order to improve the device reliability, therefore, it is necessary that the accidental failure period with a low and constant failure rate continues long.

Meanwhile, in order to eliminate initial failures in advance, it is necessary to perform a screening process. In the screening process, an acceleration operation for aging is applied for a prescribed period so that any defect is made conspicuous, and a defective device found as a result is rejected. For a short term and effective screening process, such a screening test that reveals an initial failure in a short time is desirably performed.

Currently, a high temperature operation test (burn-in test) is generally conducted as one of the screening methods. The burn-in test can directly evaluate a dielectric film of an actual device, and the test reveals every defect cause including migration of an aluminum interconnection by applying high temperature and high electric field stresses. In recent years, the burn-in test as described above has been performed against a wafer before a semiconductor memory device is packaged, and a large number of chips have been tested at a time.

FIG. 7 is a circuit diagram showing a circuit configuration concerning a burn-in test in a conventional semiconductor memory device.

Referring to FIG. 7, a row decoder of the conventional semiconductor memory device includes a predecode circuit 26a, a main decode circuit 326b for driving even-numbered word lines WL0, WL2 according to an output of predecode circuit 26a, row address signals RA0, RA1, a potential at a pad PD0 for testing (hereinafter, referred to as test pad PD0) and a test signal TMRS, and a main decode circuit 326c for driving odd-numbered word lines WL1, WL3 according to the output of predecode circuit 26a, row addresses RA0, RA1, a potential at a pad PD1 for testing (hereinafter, referred to as test pad RA1) and test signal TMRS.

Predecode circuit 26a includes an AND circuit 52 for receiving row address signals /RA2, /RA3 and outputting a signal X4, an AND circuit 54 for receiving row address signals /RA4, /RA5 and outputting a signal X8, and an AND circuit 56 for receiving row address signals /RAG, /RA7 and outputting a signal X12.

Main decode circuit 326b includes a composite gate circuit 362 for driving a signal RX0 to the high level (hereinafter, referred to as the H level) when test signal TMRS is at the low level (hereinafter, referred to as the L level) and row address signals /RA0, /RA1 are both at the H level and for driving signal RX0 to the H level according to the potential at test pad PD0 when test signal TMRS is at the H level.

Main decode circuit 326b further includes a composite gate circuit 364 for driving a signal RX2 to the H level when test signal TMRS is at the L level and row address signals /RA0, /RA1 are both at the H level and for driving signal RX2 to the H level according to the potential at test pad PD0 when test signal TMRS is at the H level.

Main decode circuit 326b further includes a composite gate circuit 368 for driving its output to the H level when test signal TMRS is at the L level and signals X4, X8, X12 are all at the H level.

Main decode circuit 326b further includes a word driver 70 for activating word line WL0 when signal RX0 and the output of composite gate circuit 368 are at the H and L levels, respectively, and a word driver 72 for activating word line WL2 when signal RX2 and the output of composite circuit 368 are at the H and L levels, respectively.

Word driver 70 includes a P channel MOS transistor 74 and an N channel MOS transistor 76 which are connected in series between a node supplied with signal RX0 and a ground node. The gates of N channel MOS transistor 76 and P channel MOS transistor 74 are supplied with the output of composite gate circuit 368. A node for connecting P channel MOS transistor 74 and N channel MOS transistor 76 is connected to word line WL0.

Word driver 72 includes a P channel MOS transistor 78 and an N channel MOS transistor 80 which are connected in series between a node supplied with signal RX2 and the ground node. The gates of P channel MOS transistor 78 and N channel MOS transistor 80 are supplied with the output of composite gate circuit 308. A node for connecting P channel MOS transistor 78 and N channel MOS transistor 80 is connected to word line WL2.

Main decode circuit 326c includes a composite gate circuit 382 for driving a signal RX1 to the H level when test signal TMRS is at the L level and row address signals RA0, /RA1 are both at the H level and for driving signal RX1 to the H level according to the potential at test pad PD1 when test signal TMRS is at the H level.

Main decode circuit 326c further includes a composite gate circuit 384 for driving a signal RX3 to the H level when test signal TMRS is at the L level and row address signals RA0, RA1 are both at the H level and for driving signal RX3 to the H level according to the potential at test pad RA1 when test signal TMRS is at the H level.

Main decode circuit 326c further includes a composite gate circuit 388 for driving its output to the H level when test signal TMRS is at the L level and signals X4, X8, X12 are all at the H level.

Main decode circuit 326c further includes a word driver 90 for activating word line WL1 when signal RX1 and the output of composite gate circuit 388 are at the H and L levels, respectively, and a word driver 92 for activating word line WL3 when signal RX3 and the output of composite gate circuit 388 are at the H and L levels, respectively.

Word driver 90 includes a P channel MOS transistor 94 and an N channel MOS transistor 96 which are connected in series between a node supplied with signal RX1 and the ground node. The gates of N channel MOS transistor 96 and P channel MOS transistor 94 are supplied with the output of composite gate circuit 388. A node for connecting P channel MOS transistor 74 and N channel MOS transistor 76 is connected to word line WL1.

Word driver 92 includes a P channel MOS transistor 98 and an N channel MOS transistor 100 which are connected in series between a node supplied with signal RX3 and the ground node. The gates of P channel MOS transistor 98 and N channel MOS transistor 100 are supplied with the output of composite gate circuit 388. A node for connecting P channel MOS transistor 98 and N channel MOS transistor 100 is connected to word line WL3.

In short, the conventional semiconductor memory device has a circuit configuration in which the word lines are divided into two groups of even-numbered and odd-numbered sides and the potential of each word line group can be controlled from two dedicated pads in order to detect a burn-in defect.

In the conventional semiconductor memory device, the circuit shown in FIG. 7 is used to collectively activate or inactivate the even-numbered word line group and the odd-numbered word line group so as to provide a potential difference between the even-numbered word line group and the odd-numbered word line group. Thus, stress is applied to the semiconductor memory device to eliminate a burn-in defect.

However, in the conventional circuit configuration as described above, the word lines included in the even-numbered word line group always have an identical potential. Similarly, the word lines included in the odd-numbered word line group always have an identical potential. For such potential application, if the even-numbered word lines are arranged close to each other or the odd-numbered word lines are arranged close to each other, stress cannot be applied to a defect portion such as a leakage defect if it is found where the word lines are closely arranged, and the defect cannot be eliminated by using the burn-in test.

FIG. 8 is a schematic view for illustrating a defect which cannot be eliminated by the conventional circuit configuration.

Referring to FIG. 8, when word lines WL0, WL1, and WL2 are arranged in parallel in this order, word lines WL0, WL2 are provided with contact windows C0, C2 and word line WL1 includes a portion, which is not provided with a contact window, near contact windows C0, C2. If such a portion is etched excessively in a process for providing the contact windows, a conductive material filled in the contact windows may cause a leakage defect.

FIG. 9 is a circuit diagram for illustrating the defect portion shown in FIG. 8.

Referring to FIG. 9, the conventional semiconductor memory device includes word drivers 392, 396, 394 and 398 for activating word lines WL0 to WL3, respectively.

Here, word drivers 392, 394 provided for even-numbered word lines WL0, WL2 are arranged on the same side of a memory array, and word drivers 396, 398 for driving odd-numbered word lines WL1, WL3 are arranged on the opposite side of the memory array with respect to word drivers 392, 394 for driving the even-numbered word lines.

Word driver 392 includes a P channel MOS transistor 402 and an N channel MOS transistor 404 which are connected in series between a node supplied with a predecode signal RX0 and a ground node. The gates of P channel MOS transistor 402 and N channel MOS transistor 404 are supplied with a decoded row address signal IA0.

Word driver 394 includes a P channel MOS transistor 406 and an N channel MOS transistor 408 which are connected in series between a node supplied with a predecode signal RX2 and the ground node. The gates of P channel MOS transistor 406 and N channel MOS transistor 408 are supplied with a decoded row address signal IA1.

Word driver 396 includes a P channel MOS transistor 410 and an N channel MOS transistor 412 which are connected in series between a node supplied with a predecode signal RX1 and the ground node. The gates of P channel MOS transistor 410 and N channel MOS transistor 412 are supplied with a decoded row address signal IA2.

Word driver 398 includes a P channel MOS transistor 414 and an N channel MOS transistor 41G which are connected in series between a node supplied with a predecode signal RX3 and the ground node. The gates of P channel MOS transistor 414 and N channel MOS transistor 416 are supplied with a decoded row address signal IA3.

A node for connecting P channel MOS transistor 402 and N channel MOS transistor 404 is connected to word line WL0 through contact window C0. A node for connecting P channel MOS transistor 406 and N channel MOS transistor 408 is connected to word line WL2 through contact window C2.

Contact windows C0, C2 have the positional relationship as shown in FIG. 9, and any contact window which is to be connected to word line WL1 is not provided near these contact windows. Therefore, if excessive etching is performed to provide contact windows C0, C2 in the conventional semiconductor memory device, the conductive material filled in the contact windows may cause a bridge.

SUMMARY OF THE INVENTION

An object of the present invention is to provide a semiconductor memory device with an improved defect elimination rate by a burn-in test, capable of increasing the degree of freedom in setting the potential of each word line and bit line and applying various stresses to portions between the word lines during the burn-in test.

In summary, the present invention is a semiconductor memory device including a memory array, first to fourth word lines, and a row decode circuit.

The memory array includes a plurality of memory cells arranged in rows and columns. The first to fourth word lines are provided correspondingly to first to fourth successively adjacent rows of the plurality of memory cells. The row decode circuit can activate one of the fist to fourth word lines according to an externally applied address signal in a normal operation, and can independently activate the first to fourth word lines from one other according to an externally applied test signal in a test operation.

According to another aspect of the present invention, a semiconductor memory device includes a memory array, bit line pairs, an equalize circuit, and a potential switch circuit.

The memory array includes a plurality of memory cells arranged in rows and columns. The bit line pairs are provided correspondingly to the columns of the plurality of memory cells and each include first and second bit lines. The equalize circuit applies an equalize potential to the first and second bit lines to equalize the potentials of the first and second bit lines. The potential switch circuit selectivity applies as the equalize potential one of a power supply potential and a ground potential to the equalize circuit a according to external setting in a test operation.

Therefore, a major advantage of the present invention is that the potentials of the four successively adjacent word lines can be controlled independently from an outside unit, and therefore various stresses due to a burn-in test can be applied and the defect elimination rate can be improved.

Another advantage of the present invention is that various stresses can be applied to memory cells and the defect elimination rate by the burn-in test can be improved further.

The foregoing and other objects, features, aspects and advantages of the present invention will become more apparent from the following detailed description of the present invention when taken in conjunction with the accompanying drawings

DESCRIPTION OF THE PREFERRED EMBODIMENTS

Figure 1:
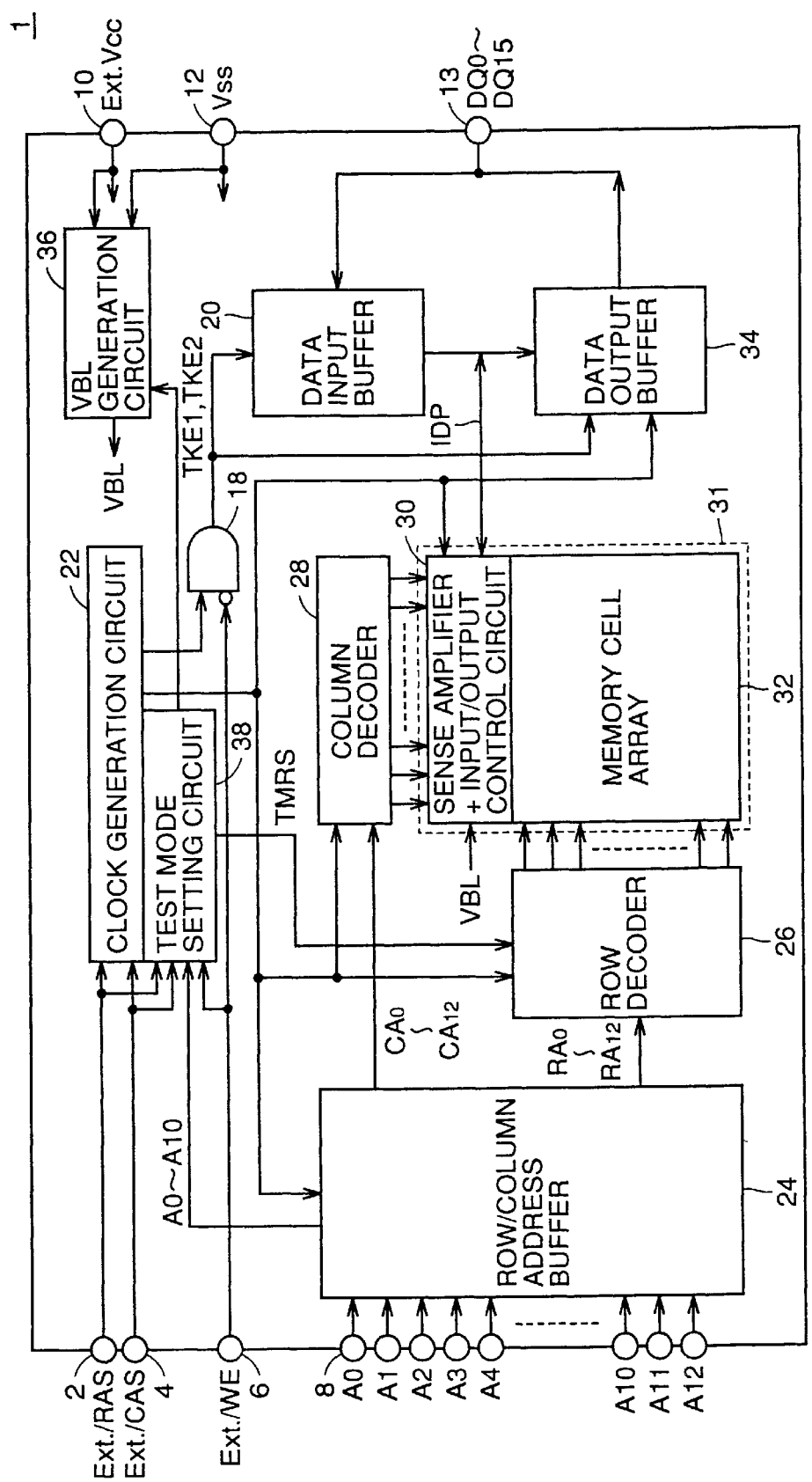
FIG. 1 is a block diagram showing a schematic configuration of a semiconductor memory device 1 according to an embodiment of the present invention.

In the following, the embodiments of the present invention will be described in detail with reference to the drawings. In the drawings, the same reference characters denote the same or corresponding parts.

First Embodiment

FIG. 1 is a block diagram showing a schematic configuration of a semiconductor memory device 1 which is an embodiment of the present invention.

Referring to FIG. 1, semiconductor memory device 1 includes control signal input terminals 2 to 6 for receiving control signals Ext./RAS, Ext./CAS, Ext./WE, address input terminals 8 for receiving address signals A0 to A12, input/output terminals 13 for inputting/outputting data signals DQ0 to DQ15, a ground terminal 12 supplied with a ground potential Vss, and a power supply terminal 10 supplied with an external power supply potential Ext.Vcc.

Semiconductor memory device 1 further includes a clock generation circuit 22, a row/column address buffer 24, a row decoder 26, a column decoder 28, a memory mat 31, a gate circuit 18, a data input buffer 20, and a data output buffer 34.

Memory mat 31 includes a memory cell array 32 having memory cells arranged in rows and columns, and a sense amplifier+input/output control circuit 30 for inputting and outputting data to and from the memory cell array.

Clock generation circuit 22 generates control clocks which correspond to a prescribed operation mode based on external row address strobe signal Ext./RAS and external column address strobe signal Ext./CAS applied externally through control signal input terminals 2, 4, and controls an operation of the entire semiconductor memory device.

Row/column address buffer 24 applies, to row decoder 26 and column decoder 28, address signals RA0 to RA12, CA0 to CA12 which are generated according to externally applied address signals A0 to A12.

Such a memory cell in memory cell array 32 that is designated by row decoder 26 and column decoder 28 is coupled to an internal data bus IDP by sense amplifier+input/output control circuit 30. Internal data bus IDP receives data signals DQ0 to DQ15 from input/output terminals 13 through data input buffer 20, or outputs data signals DQ0 to DQ15 to input/output terminals 13 through data output buffer 34.

Semiconductor memory device 1 further includes a test mode setting circuit 38 for outputting test signals TMRS, TK1, TKE2 according to external row address strobe signal Ext./RAS, external column address strobe signal Ext./CAS, external write enable signal Ext./WE and address signals A0 to A10, and a VBL generation circuit 36 for receiving external power supply potential Ext.Vcc and ground potential Vss and generating an intermediate potential VBL according to test signals TKE1, TKE2.

Figure 2:
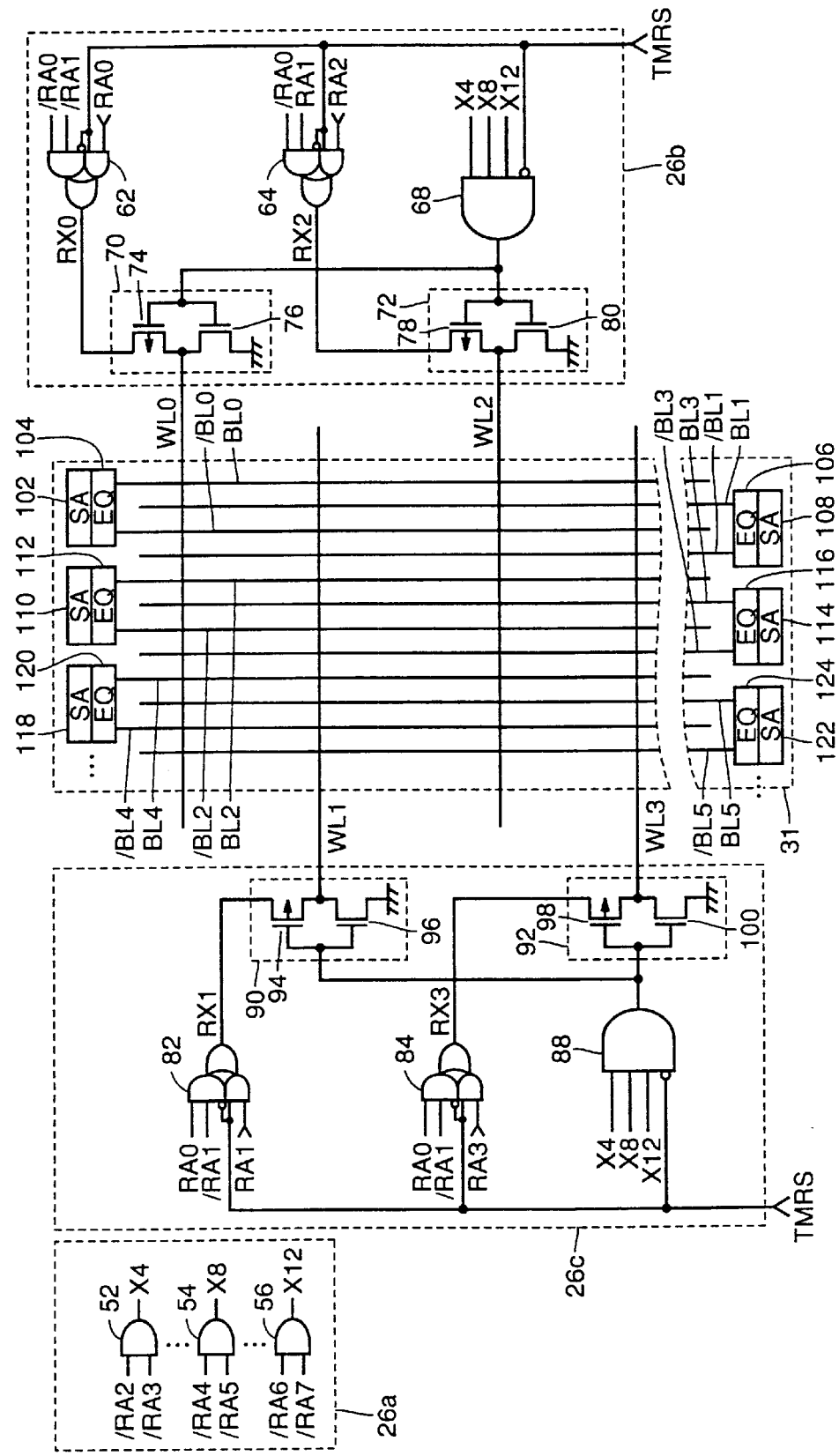
FIG. 2. is a circuit diagram showing a unit circuit of row decoder 26 shown in FIG. 1.

FIG. 2 is a circuit diagram showing a unit circuit of row decoder 26 shown in FIG. 1.

In FIG. 2, memory mat 31 is representively shown to illustrate the positional relationship.

Referring to FIG. 2, row decoder 26 includes a predecode circuit 26a for receiving and predecoding row addresses from row/column address buffer 24 shown in FIG. 1, a main decode circuit 26b for driving even-numbered word lines WTL0, WL2 according to an output of predecode circuit 26a, row address signals RA0, RA1, RA2 and test signal TMRS, and a main decode circuit 26c for driving odd-numbered word lines WL1, WL3 according to the output of predecode circuit 26a, row addresses RA0, RA1, RA3 and test signal TMRS. Word lines WL0 to WL3 are four successively adjacent word lines, and word lines WL0 to WL3 of word lines in the memory array are representatively shown in FIG. 2. Therefore, a unit of four word lines is repeatedly arranged adjacent to word lines WL0 to WL3.

Predecode circuit 26a includes an AND circuit 52 for receiving row address signals /RA2, /RA3 and outputting a signal X4, an AND circuit 54 for receiving row address signals /RA4, /RA5 and outputting a signal X8, and an AND circuit 56 for receiving row address signals /RAG, /RA7 and outputting a signal X12.

Main decode circuit 26b includes a composite gate circuit 62 for driving a signal RX0 to the H level when test signal TMRS is at the L level and row address signals /RA0, /RA1 are both at the H level and for driving signal RX0 to the H level when test signal TMRS is at the H level and row address signal RA0 is at the H level.

Main decode circuit 26b further includes a composite gate circuit 64 for driving a signal RX2 to the H level when test signal TMRS is at the L level and row address signals /RA0, RA1 are both at the H level and for driving signal RX2 to the H level when test signal TMRS is at the H level and row address signal RA2 is at the H level.

Main decode 26b further includes a composite gate circuit 68 for driving its output to the H level when test signal TMRS is at the L level and signals X4, X8, X12 are all at the H level.

Main decode circuit 26b further includes a word driver 70 for activating word line WL0 when signal RX0 and the output of composite gate circuit 68 are at the H and L levels, respectively, and a word driver 72 for activating word line WL2 when signal RX2 and the output of composite gate circuit 68 are at the H and L levels, respectively.

Word deliver 70 includes a P channel MOS transistor 74 and an N channel MOS transistor 76 which are connected in series between a node supplied with signal RX0 and a ground node. The gates of N channel MOS transistor 76 and P channel MOS transistor 74 are both supplied with the output of composite gate circuit 68. A node for connecting P channel MOS transistor 74 and N channel MOS transistor 76 is connected to word line WL0.

Word driver 72 includes a P channel MOS transistor 78 and an N channel MOS transistor 80 which are connected in series between a node supplied with signal RX2 and the ground node. The gates of P channel MOS transistor 78 and N channel MOS transistor 80 are both supplied with the output of composite gate circuit 68. A node for connecting P channel MOS transistor 78 and N channel MOS transistor 80 is connected to word line WL2.

Main decode circuit 26c includes a composite gate circuit 82 for driving a signal RX1 to the H level when test signal TMRS is at the L level and row address signals RA0, /RA1 are both at the H level and for driving signal RX1 to the H level when test signal TMRS is at the H level and row address signal RA1 is at the H level.

Main decode circuit 26c further includes a composite gate circuit 84 for driving a signal RX3 to the H level when test signal TMRS is at the L level and row address signals RA0, RA1 are both at the H level and for driving signal RX3 to the H level when test signal TMRS is at the H level and row address signal RA3 is at the H level.

Main decode circuit 26c further includes a composite gate circuit 88 for driving its output to the H level when test signal TMRS is at L level and signals X4, X8, X12 are all at the H level.

Main decode circuit 26c further includes a word driver 90 for activating word line WL1 when signal RX1 and the output of composite gate circuit 88 are at the H and L levels, respectively, and a word deliver 92 for activating word line WL3 when signal RX3 and the output of composite gate circuit 88 are at the H and L levels, respectively.

Word driver 90 includes a P channel MOS transistor 94 and an N channel MOS transistor 96 which are connected in series between a node supplied with signal RX0 and the ground node. The gates of N channel MOS transistor 96 and P channel MOS transistor 94 are both supplied with the output of composite gate circuit 88. A node for connecting P channel MOS transistor 74 and N channel MOS transistor 76 is connected to word line WL1.

Word driver 92 includes a P channel MOS transistor 98 and an N channel MOS transistor 100 which are connected in series between a node supplied with signal RX3 and the ground node. The gates of P channel MOS transistor 98 and N channel MOS transistor 100 are both supplied with the output of composite gate circuit 88. A node for connecting P channel MOS transistor 98 and N channel MOS transistor 100 is connected to word line WL3.

In memory mat 31, word lines WL0 to WL3 orthogonally cross bit lines BL0 to BL5, /BL0 to /BL5.

A sense amplifier 102 and an equalize circuit 104 are provided correspondingly to bit lines BL0, /BL0. A sense amplifier 110 and an equalize circuit 112 are provided correspondingly to bit lines BL2, /BL2. A sense amplifier 118 and an equalize circuit 120 are provided correspondingly to bit lines BL4, /BL4. Equalize circuits 104, 112, 120 and sense amplifiers 102, 110, 118 are provided on a first side of the memory array.

Meanwhile, an equalize circuit 106 and a sense amplifier 108 are provided correspondingly to bit lines BL1, /BL1. An equalize circuit 116 and a sense amplifier 114 are provided correspondingly to bit lines BL3, /BL3. An equalize circuit 124 and a sense amplifier 122 are provided correspondingly to bit lines BL5, /BL5. Sense amplifiers 108, 114, 122 and equalize circuits 106, 116, 124 are provided on a second side of the memory array, opposite to the first side.

Figure 3:
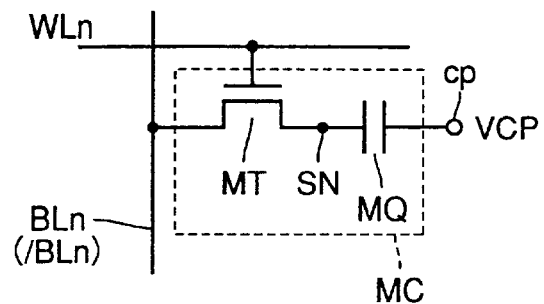
FIG. 3 is a circuit diagram showing a configuration of a memory cell MC provided correspondingly to a crossing between a word line and a bit line of memory mat 31 in FIG. 2.

FIG. 3 is a circuit diagram showing a configuration of a memory cell MC which is provided correspondingly to a crossing of a word line and a bit line of memory mat 31 in FIG. 2.

Referring to FIG. 3, memory cell MC includes a memory capacitor MQ for storing information, and an access transistor MT formed of an N channel MOS transistor for connecting the storage node SN of memory capacitor MQ to bit line BLn or /BLn (n is a natural number) in response to a signal potential on word line WL. The cell plate node CP of memory capacitor MQ is supplied with a prescribed cell plate potential VCP.

Figure 4:
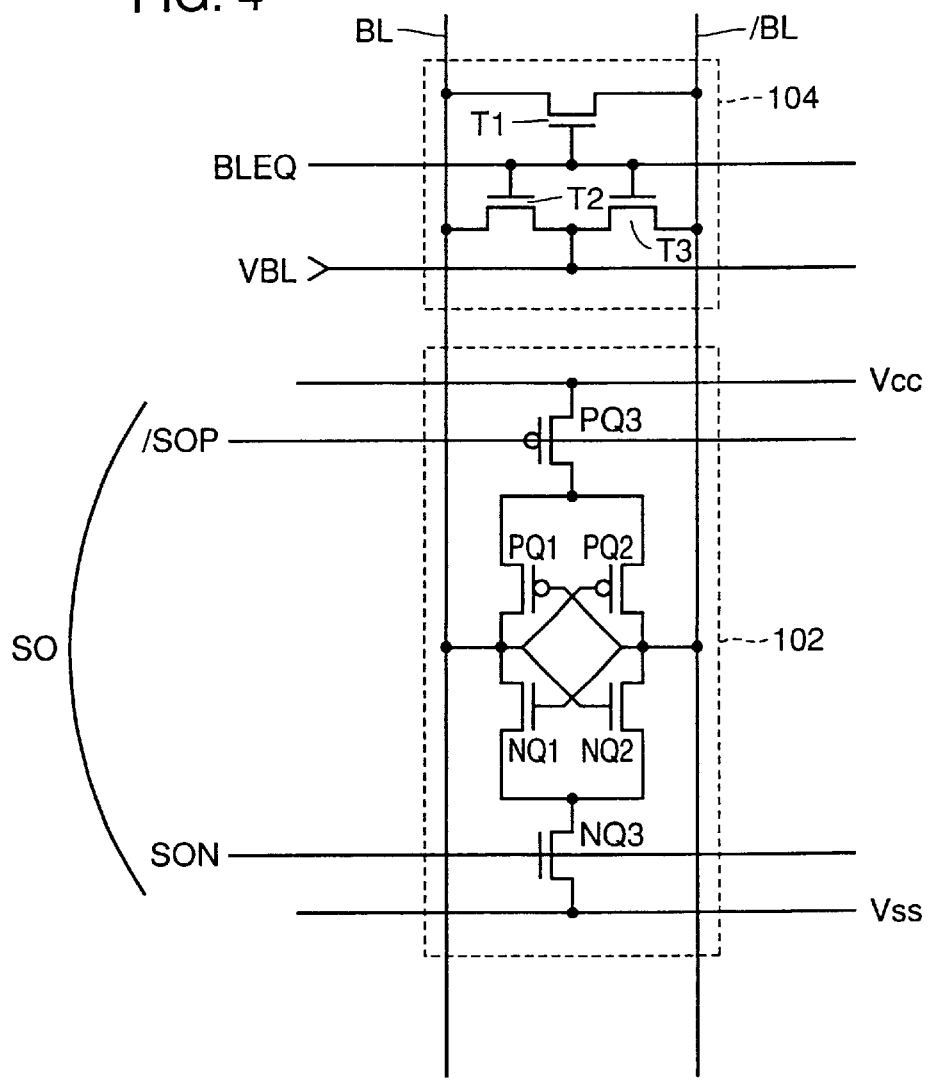
FIG. 4 is a circuit diagram showing a configuration of equalize circuit 104 and sense amplifier 102 in FIG. 2.

FIG. 4 is a circuit diagram showing a configuration of equalize circuit 104 and sense amplifier 102 in FIG. 2.

Referring to FIG. 4, equalize circuit 104 includes an N channel MOS transistor T1 rendered conductive in response to an equalize circuit BLEQ and thereby electrically connecting bit lines BL and /BL, and N channel MOS transistors T2, T3 rendered conductive in response to equalize signal BLEQ and thereby transmitting a prescribed intermediate potential VBL to bit lines BL and /BL, respectively.

Sense amplifier 102 includes P channel MOS transistors PQ1, PQ2 having their gates and drains cross coupled, N channel MOS transistors NQ1, NQ2 having their gates and drains cross coupled, a P channel MOS transistor PQ3 rendered conductive in response to a sense amplifier activation signal /SOP and thereby coupling power supply potential Vcc to the sources of P channel MOS transistors PQ1, PQ2, and an N channel MOS transistor NQ3 rendered conductive in response to a sense amplifier activation signal SON and thereby transmitting ground potential Vss to the sources of N channel MOS transistors NQ1, NQ2. The drains of P channel MOS transistor PQ1 and N channel MOS transistor NQ1 are connected to bit line BL, and the drains of P channel MOS transistor PQ2 and N channel MOS transistor NQ2 are connected to bit line /BL.

Sense amplifier activation signals SON, /SOP and equalize signal BLEQ are generated in clock generation circuit 22 of FIG. 1 according to external row address strobe signal Ext./RAS and external column address strobe signal Ext./CAS.

In the following, an operation of the semiconductor memory device in the first embodiment during a burn-in test will be described briefly.

Referring again to FIG. 2, test signal TMRS is set to the H level dining the burn-in test. Test signal TMRS is generated by test mode setting circuit 38 in FIG. 1 according to the external row strobe signals, the external column strobe signals and so on.

When test signal TMRS attains the H level, the outputs of composite gate circuits 68, 88 are both driven to the L level. Therefore, word drivers 70, 72 activate word lines WL0, WL2 when signals RX0, RX2 attain the H level. Similarly, word drivers 90, 92 activate word lines WL1, WL3 when signals RX1, RX3 attain the H level.

When test signal TMRS is at the H level, signals RX0 to RX3 can be set by composite gate circuits 62, 82, 64, 84 according to row address signals RA0 to RA3. Since row address signals RA0 to RA3 are applied directly through address terminals from external circuitry, the potentials on word lines WL0 to WL3 can be set to arbitrary combinations, that is, 16 combinations.

Figure 8:
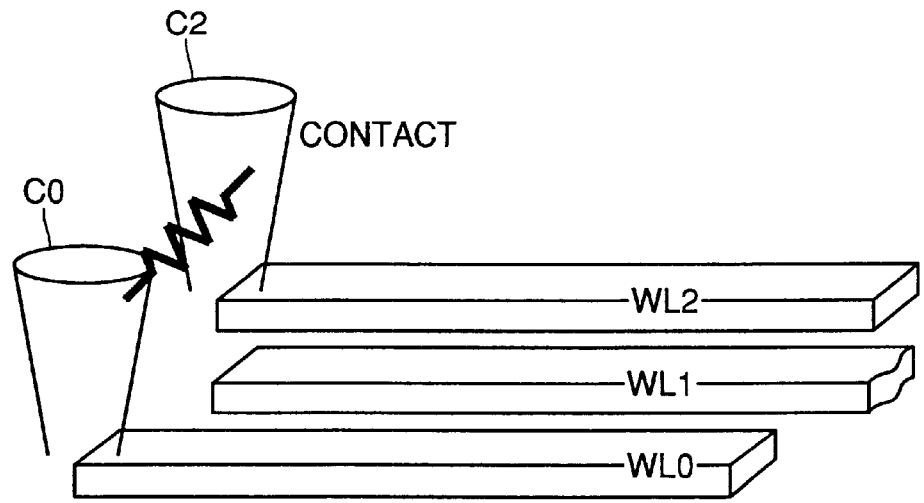
FIG. 8 is a schematic view for illustrating a defect which cannot be eliminated by the conventional circuit configuration.
Figure 9:
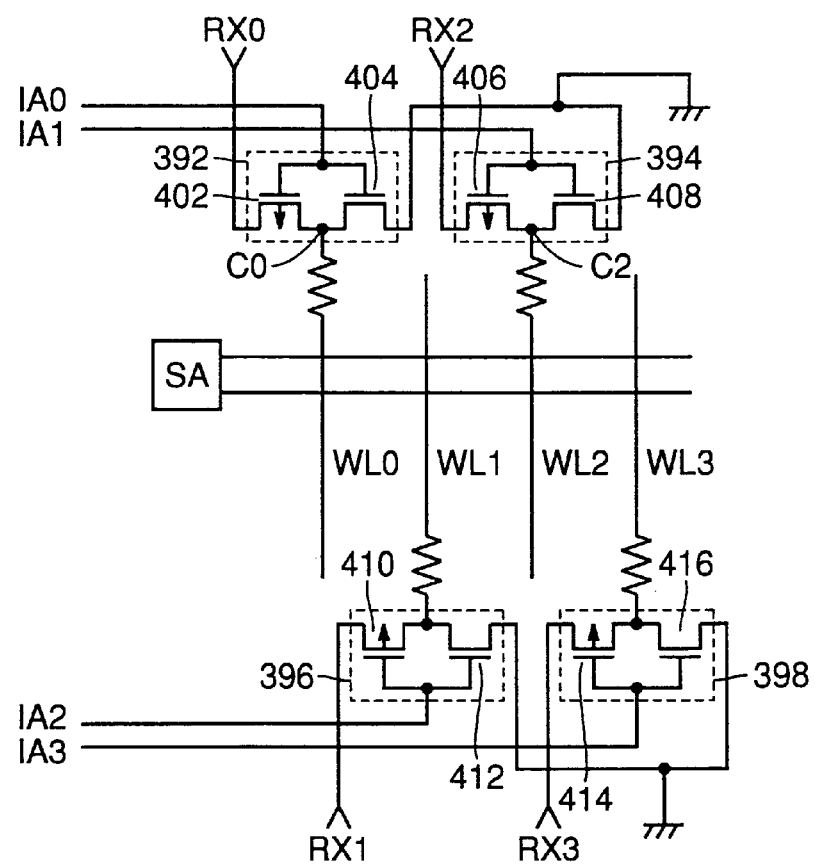
FIG. 9 is a circuit diagram for illustrating the defect portion shown in FIG. 8.

Since the row decoder is formed of four successively adjacent word lines as shown in FIG. 2 as a unit, if the four successively adjacent word lines are set properly as a unit, the potentials between the four word lines and adjacent word lines can be set properly and the leakage defect as described with reference to FIGS. 8 and 9 can be eliminated.

In FIG. 2, the present invention is applied to a minimum unit of four successively adjacent word lines. It can be easily contemplated that eight successively adjacent word lines as a unit correspond to address signals A0 to A7 and the word lines can be driven in a test mode.

Second Embodiment

Differently from the first embodiment, a semiconductor memory device in a second embodiment includes a potential switch circuit 202 which can receive intermediate potential VBL output from VBL generation circuit 36 in FIG. 1, apply, during a normal operation, intermediate potential VBL to the equalize circuits included in sense amplifier+input/output control circuit 30, and apply, during a burn-in test, the power supply potential or the ground potential instead of intermediate potential VBL to the equalize circuits according to test signals TKE1 and TMRS.

Figure 5:
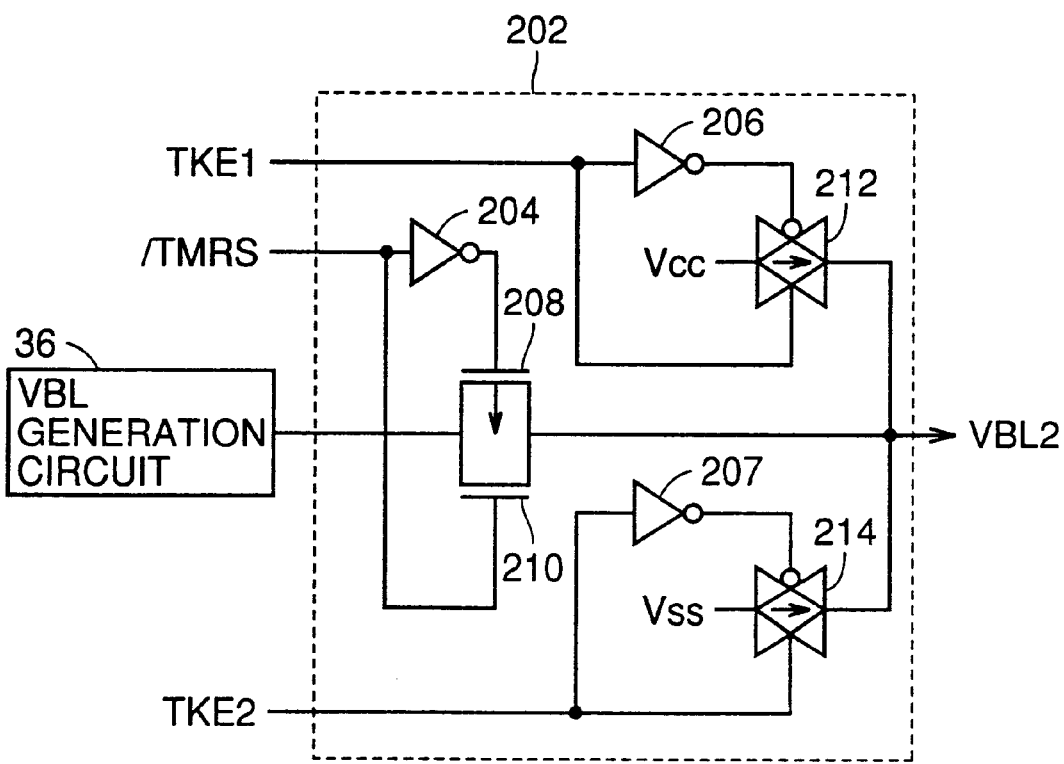
FIG. 5 is a circuit diagram showing a configuration of a potential switch circuit 202.

FIG. 5 is a circuit diagram showing a configuration of potential switch circuit 202.

Referring to FIG. 5, potential switch circuit 202 includes an inverter 204 for receiving and inverting test signal TMRS, and an N channel MOS transistor 210 and a P channel MOS transistor 208 rendered conductive when test signal TMRS is at the Level, that is, during the normal operation and thereby outputting as potential VBL2 potential VBL generated from VBL generation circuit 36.

Potential switch circuit 202 further includes an inverter 206 for receiving and inverting test signal TKE1, a transmission gate 212 for outputting power supply potential Vcc as potential VBL2 when test signal TKE1 is at the H level according to the output of inverter 206 and test signal TKE1, an inverter 207 for receiving and inverting test signal TKE2, and a transmission gate 214 for outputting ground potential Vss as potential VBL2 when test signal TKE2 is at the H level according to the output of inverter 207 and test signal TKE2.

Figure 6:
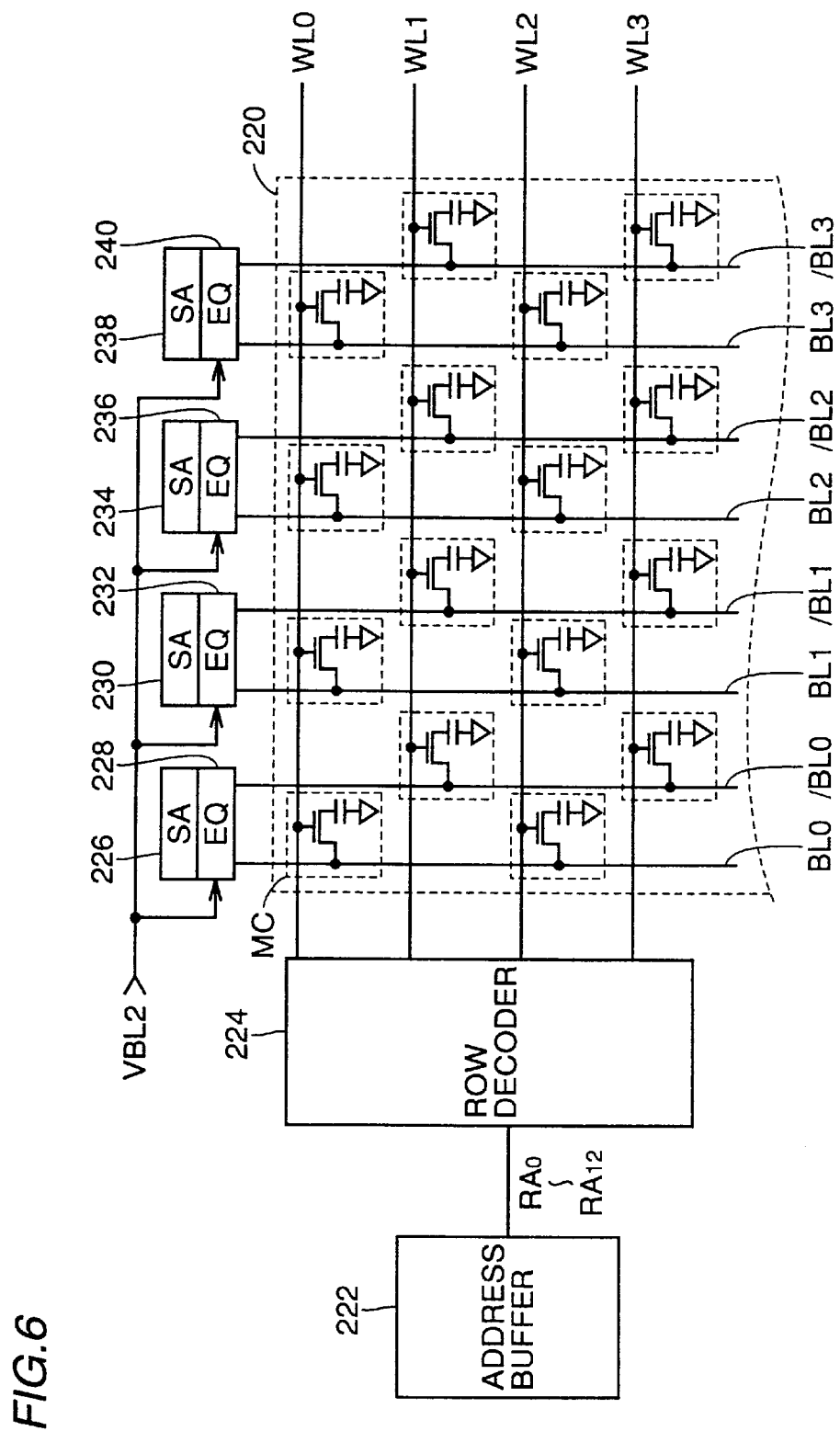
FIG. 6. is a circuit diagram for illustrating memory cell potential setting in a second embodiment.
Figure 7:
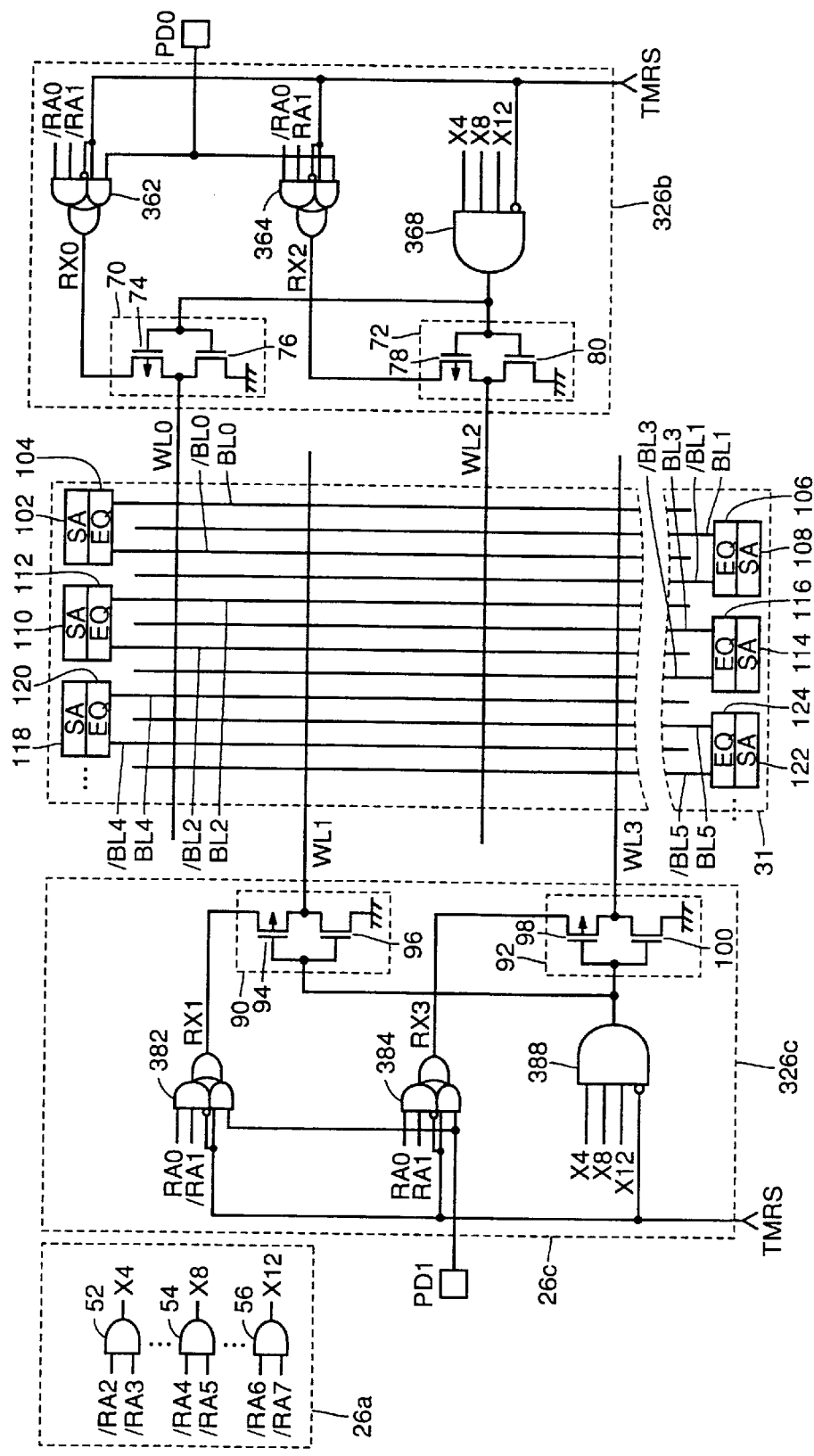
FIG. 7 is a circuit diagram showing a circuit configuration concerning a burn-in test in a conventional semiconductor memory device.

FIG. 6 is a circuit diagram for illustrating memory cell potential setting in the second embodiment.

Referring to FIG. 6, an equalize circuit 228 and a sense amplifier 226 are provided correspondingly to bit lines BL0, /BL0. An equalize circuit 232 and a sense amplifier 230 are provided correspondingly to bit lines BL1, /BL1. An equalize circuit 23G and a sense amplifier 234 are provided correspondingly to bit lines BL2, /BL2. An equalize circuit 240 and a sense amplifier 238 are provided correspondingly to bit lines BL3, /BL3.

An address buffer 222 for externally receiving address signals and outputting row addresses outputs row address signals RA0 to RA12. A row decoder 224 is further provided which decodes row address signals RA0 to RA12 and activates word lines WL0 to WL3. Correspondingly to crossings of word lines WL0 to WL3 and bit lines BL0 to BL3, /BL0 to BL3, memory cells MC which form a memory cell array 220 are provided. Since sense amplifiers 226, 230, 234, 238 and equalize circuits 228, 232, 236, 240 have similar configurations to those shown in FIG. 4, description thereof will not be repeated. In addition, memory cell MC has a similar configuration to the one shown in FIG. 3 and its description will not be repeated.

In the second embodiment, potential VBL2 is applied instead of intermediate potential VBL, which is applied to equalize circuits 228, 232, 236 and 240.

Referring again to FIG. 5, in the normal operation, test signals TMRS, TKE1, TKE2 are all at the L level, and therefore N channel MOS transistor 210 and P channel MOS transistor 208 are conductive and potential VBL2 is intermediate potential VBL which is output from VBL generation circuit 36. After bit lines BL, /BL are both driven to intermediate potential VBL by equalize circuit 104 of FIG. 4, memory cells are connected to one of bit lines BL, /BL, resulting in a potential difference between bit lines BL, /BL. The potential difference is amplified by sense amplifier 102 shown in FIG. 4, and the potential difference between bit lines BL, /BL is widened.

During the burn-in test, test signal TMRS is at the H level, and therefore N channel MOS transistor 210 and P channel MOS transistor 208 are not conductive. Potential VBL2 can be set to power supply potential Vcc by activating test signal TKE1. If test signal TKE2 is activated to the H level, potential VBL2 can be set to ground potential Vss.

Since potential VBL2 is applied to equalize circuits, the equalize circuits can apply potential VBL2 to bit lines BL, /BL as in the configuration shown in FIG. 4 if equalize signal BLEQ is set to the H level. Since activation of word lines WL0 to WL3 can be controlled externally in the burn-in mode as described in the first embodiment, various patterns can be written to memory cells by combining test signals TK21, TKE2 and address signals A0 to A3.

As a result, various stresses can be applied to the memory cells, and the defect elimination rate by the burn-in test can be improved further.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory array including a plurality of memory cells arranged in rows and columns;
   first to fourth word lines provided correspondingly to first to fourth successively adjacent rows of said plurality of memory cells; and
   a row decode circuit capable of activating one of said first to fourth word lines according to an externally applied address signal during a normal operation, and activating said first to fourth word lines independently from one another according to an externally applied test signal during a test operation.

2. The semiconductor memory device according to claim 1, wherein said row decode circuit independently sets each of said first to fourth word lines to one potential state of high and low levels according to said test signal in order to provide a potential difference and apply stress between two arbitrary word lines of said first to fourth word lines during said test operation.

3. The semiconductor memory device according to claim 1, further comprising first to fourth input terminals, said test signal including first to fourth test bits applied externally through said first to fourth input terminals during said test operation, and said row decode circuit including first to fourth gate circuits for activating said first to fourth word lines according to said first to fourth test bits during said test operation.

4. The semiconductor memory device according to claim 3, wherein said first to fourth input terminals receive first to fourth address bits of said address signal applied externally during said normal operation.

5. The semiconductor memory device according to claim 1, wherein said row decode circuit includes a first decode portion for activating said first and third word lines, and a second decode portion for activating said second and fourth word lines, said first decode portion is provided adjacent to a first side of said memory array, and said second decode portion is provided adjacent to a second side of said memory allay which is opposite to said first side.

6. The semiconductor memory device according to claim 1, further comprising:

a bit line pair provided correspondingly to a column of said plurality of memory cells and including first and second bit lines;

an equalize circuit for applying an equalize potential to said first and second bit lines to equalize potentials of said first and second bit lines; and a potential switch circuit for selectively applying one of a power supply potential and a ground potential as said equalize potential to said equalize circuit according to external setting during said test operation.

7. The semiconductor memory device according to claim 6, further comprising:

an intermediate potential generation circuit for generating an intermediate potential between said power supply potential and said ground potential, said potential switch circuit including a first switch circuit rendered conductive during said normal operation for applying said intermediate potential to an output node, a second switch circuit selectively rendered conductive according to said setting during said test operation for applying said power supply potential to said output node, and a third switch circuit selectively rendered conductive according to said setting during said test operation for applying said ground potential to said output node.

8. she semiconductor memory device according to claim 6, wherein said equalize circuit includes a first field effect transistor provided between said first bit line and said second bit line, a second field effect transistor provided between a node supplied with said equalize potential and said first bit line and having a gate connected to a gate of said first field effect transistor, and a third field effect transistor provided between a node supplied with said equalize potential and said second bit line and having a gate connected to the gate of said first field effect transistor.

9. A semiconductor memory device, comprising:

a memory array including a plurality of memory cells arranged in rows and columns;

four word lines provided corresponding to four successively adjacent rows of said plurality of memory cells; and a row decode circuit activating said four word lines in response to an address signal and four externally applied test signals, said row decode circuit including four gate circuits respectively provided corresponding to said four word lines, each of said four gate circuits selectively activating a corresponding one of said four word lines in response to a decoding result of two signal bits of said address signal during a normal operation, and activating the corresponding word line in response to a corresponding one of said four externally applied test signal during a test operation.

\* \* \* \* \*